US010804869B2

(12) United States Patent
James (10) Patent No.: US 10,804,869 B2
(45) Date of Patent: Oct. 13, 2020

(54) APPARATUS AND METHOD FOR ADJUSTING AN ACOUSTIC SIGNAL

(71) Applicant: SARONIKOS TRADING AND SERVICES, UNIPESSOAL LDA, Funchal/Madeira (PT)

(72) Inventor: Robert James, Hatfield (GB)

(73) Assignee: Saronikos Trading and Services, Unipessoal LDA, Funchal, Madeira (PT)

( * ) Notice: Subject to any disclaimer, the term of this patent is extended or adjusted under 35 U.S.C. 154(b) by 0 days.

(21) Appl. No.: 16/098,383

(22) PCT Filed: May 3, 2016

(86) PCT No.: PCT/EP2016/059857
§ 371 (c)(1),
(2) Date: Nov. 1, 2018

(87) PCT Pub. No.: WO2017/190768
PCT Pub. Date: Nov. 9, 2017

(65) Prior Publication Data
US 2019/0158050 A1    May 23, 2019

(51) Int. Cl.
*H03G 3/32*    (2006.01)
*H03G 3/20*    (2006.01)
(Continued)

(52) U.S. Cl.
CPC .............. *H03G 3/32* (2013.01); *G10K 15/02* (2013.01); *H04M 19/044* (2013.01); *H04M 1/725* (2013.01)

(58) Field of Classification Search
CPC ........... H04M 19/044; H04M 1/72569; H04M 2250/12
(Continued)

(56) References Cited

U.S. PATENT DOCUMENTS

2005/0266891 A1   12/2005  Mullen
2010/0203927 A1    8/2010  Biddy, Jr. et al.
2015/0229782 A1    8/2015  Zuidema et al.

FOREIGN PATENT DOCUMENTS

EP      2 469 828 A1    6/2012
WO    2012/123787 A1    9/2012

OTHER PUBLICATIONS

International Search Report and Written Opinion dated Jan. 11, 2017, issued in PCT Application No. PCT/EP2016/059857, filed May 3, 2016.
(Continued)

*Primary Examiner* — George C Monikang
(74) *Attorney, Agent, or Firm* — Workman Nydegger (57) ABSTRACT

A mobile communication apparatus, an accessory device, and a method for adjusting one physical property of an acoustic signal, wherein the apparatus includes a ringtone generator adapted to generate the acoustic signal, an ultrasound receiver apt to receive an ultrasonic signal, and a processor configured for detecting at least a physical parameter and/or a content of the ultrasonic signal, determining, on the basis of the at least one physical parameter and/or content of the ultrasonic signal, attenuation information that can quantify the attenuation suffered by the ultrasonic signal and/or the acoustic signal, determining, on the basis of the attenuation information, the physical property of the acoustic signal to be generated, and generating the acoustic signal having the determined property, so that the probability to hear the acoustic signal increases.

9 Claims, 2 Drawing Sheets

(51) Int. Cl.
*H04M 19/04* (2006.01)
*G10K 15/02* (2006.01)
*H04M 1/725* (2006.01)

(58) Field of Classification Search
USPC .............................. 381/104, 105, 107, 56, 57
See application file for complete search history.

(56) References Cited

OTHER PUBLICATIONS

Ringer Profile Tasks, http://tasker.wikidot.com/ringermenu, Sep. 9, 2010, 2 pages.
Intelligent Ringer for Android, http://download.cnet.com/Intelligent-Ringer/3000-2141_4-75887716.html, Apr. 18, 2013, 5 pages.

APPARATUS AND METHOD FOR ADJUSTING AN ACOUSTIC SIGNAL

BACKGROUND OF THE INVENTION

Field of the Invention

The invention relates to a mobile communication apparatus, an accessory device, and a method for adjusting at least a physical property of an acoustic signal, such as a ringtone of a mobile phone, so as to counterbalance an ambient acoustic noise and/or the attenuation that the acoustic signal undergoes along its propagation path.

Description of Prior Art

Mobile phones accompany the vast majority of the world population everywhere and almost everywhere they allow receptions of telephone calls and messages. Generally mobile phones users always want to have ringtones to signal incoming calls or messages, even when they do not intend to respond to them all. Ringtones can be customized so that the user can identify the caller without having to look at the visual information that usually would appear on the display. The ringtone can be accompanied, or replaced, by a vibration, customizable too, but it often happens that the user is unable to hear neither of them, especially when the phone is in a pocket or purse and an ambient acoustic noise is around, while the ringing volume is low. On the other hand, in quiet places, where a ringtone at high volume would annoy and embarrass, the volume should be kept low.

Therefore, a user should often raise and lower the ringer volume to suit the place and circumstance. In practice, this adjustment is not always done, because, when a person moves from one environment to another, he or she has probably to pay attention to more important matters than the phone ringer volume.

It is then emerged the need for automatic adjustment of the ringing volume of mobile phones, and various systems and methods have been proposed for this. Some are simply based on programming the volume of the ringtone in connection with the events and meetings of the user's agenda, others consist of external devices adapted to reproduce the ringtone, which can be placed where they can be heard more easily; and others, called "Intelligent Ringers", seek to adapt the volume of the ringtone depending on the ambient acoustic noise and the indication of proximity sensors, through which the phone should determine if it is enclosed in a pursue or in a pocket.

Programmable ringtones include, e.g., the "Profiles" of some commercial phone models. These allow the user to define different ringer settings ("Normal", "Night", "meeting", "outdoors", "Pager", "Offline"), activate at any time one of them or schedule its activation, and set their expiration time. The web page "http://tasker.wikidot.com/ringer-menu" shows an example of these profiles. This category of solutions allows you to adjust the ringtone to a specific stage of your daily agenda, but they do not satisfactorily cope with changing environmental conditions.

Among the accessories that can play ringtones in a more easily audible way there are headsets, mini speakers and visual indicators, which can be connected to phones wirelessly or by means of wires. The patent application US 2005/266891 A1 describes an example, in which the indication of incoming calls is relayed by an external device, which can be fixed on the clothes with a paperclip. The devices of this type bypass the losses suffered by ringtones when your phone is in pockets or bags, but they do not fit the silence of quiet places or counterbalance an ambient acoustic noise.

The device described by US 2010/203927 A1 can be considered an extreme case in this category of devices. This device has a receiver adapted to detect the paging messages of cellular networks for one or more mobile phones and notify the relevant incoming calls or messages to remote alarms that emit appropriate ringtones. In addition to bypass the acoustic attenuation of regular ringtones, this device can be placed in favourable places for the reception of the signals of cellular networks and cope with deficiencies of radio coverage. However, its functionality is lost when the user moves away from the place where the device is placed.

Smart ringtones, instead, aim more properly to an automatic adjustment of the ringing volume taking into account the conditions in which the phone is used, as in the example of the web page "http://download.cnet.com/Intelligent-Ringer/3000-2141_4-75887716.html". In this example, the ring volume is automatically adjusted on the basis of both ambient noise and the determination whether or not the phone is in a pocket or purse. For this determination, the application uses proximity sensors and complex algorithms, and requires a calibration on user's habits, but it does not guarantee the correctness of the result. Moreover, the system has an inherent weakness: the ambient noise is measured at the place where the phone is placed (e.g., a pocket or the like), and not at the place where the user's ear is located. Consequently, the counterbalance of the ambient noise may not be always effective.

SUMMARY OF THE INVENTION

The present invention seeks to overcome these and other shortcomings by means of a mobile communication apparatus, an accessory device and a method, for automatically adjusting an acoustic signal (herein also called ringtone) emitted by said mobile communication apparatus, typically a mobile device (within the examples of this description the main device is also referred as "mobile phone"), so as to counterbalance both the ambient acoustic noise and/or the attenuation that the ringtone undergoes along its propagation path.

The acoustic noise may be detected by means of a microphone of the accessory device (herein also referred as "adjustment accessory"), which is worn by the user of the main device, so that the adjustment accessory pickups the ambient acoustic noise where the ringtone has to be heard. The adjustment accessory transmits an ultrasonic signal, carrying at least a value of a property, e.g., the power value, of that acoustic noise. The ultrasonic signal is received by the main device, which may recover the relevant values of the environmental acoustic noise and/or assesses the attenuation that the ultrasonic signal undergoes on the basis of the power of the received ultrasonic signal. From these data the main device assesses the attenuation that the acoustic signal undergoes along its propagation path and adjusts the acoustic signal, so as to counterbalance both the ambient acoustic noise and/or the attenuation of the acoustic signal along its propagation path. This ensures that said acoustic signal is correctly perceived by the user, by reducing the risks of missing phone calls or message/events notifications.

BRIEF DESCRIPTION OF DRAWINGS

The features of the invention are specifically set forth in the claims annexed to this description; such characteristics will be clearer from the following description of a preferred and non-exclusive embodiment shown in annexed drawings, wherein:

DETAILED DESCRIPTION OF THE INVENTION

In this description, any reference to "an embodiment" will indicate that a particular configuration, structure or feature described in regard to the implementation of the invention is comprised in at least one embodiment. Therefore, the phrase "in an embodiment" and other similar phrases, which may be present in different parts of this description, will not necessarily be all related to the same embodiment. Furthermore, any particular configuration, structure or feature may be combined in one or more embodiments in any way deemed appropriate. The references below are therefore used only for the sake of simplicity, and do not limit the protection scope or extension of the various embodiments.

Figure 1:
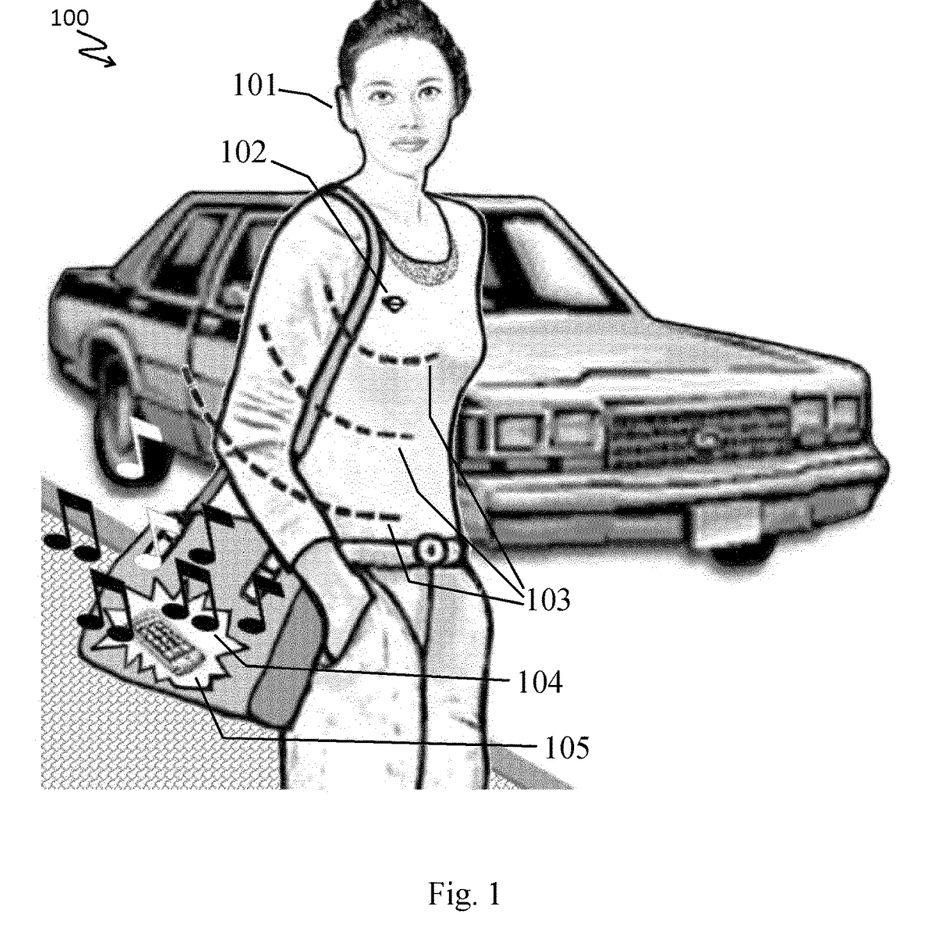
FIG. 1 shows a usage scenario of a system according to the invention comprising a mobile phone 105 and an adjustment accessory 102.

With reference to FIG. 1, a system for adjusting ringtone volume according to the present invention comprises the following parts:

- a main device 105, preferably a mobile phone, that is adapted to emit an acoustic signal 104 (also referred as 'ringtone') for alerting a user to an event, e.g., an incoming call, a notification message, or the like;
- an accessory device 102 (also referred as 'adjustment accessory'), which transmits (cyclically) an ultrasonic signal 103 that carries a data packet comprising at least a value of a property of the ambient noise (for easing description, herein the power value will be taken as an example of a value of a property of the ambient noise).

The scenario of typical use of the present invention, as schematically represented in FIG. 1, is one in which a user 101, coming out of a house or an office, where the ringtones 104 emitted by the main device 105 (a personal phone, in this example) is kept at a low volume, puts her personal phone 105 into a bag and drops into a street with a noisy vehicular traffic. The user wears the adjustment accessory 102, which transmits an ultrasonic signal 103. This ultrasonic signal 103 carries a data packet that conveys a measure of a property of the ambient noise (e.g., the psophometric noise power), which is picked up by a microphone of the adjustment accessory 102.

The main device 105 receives at least one said ultrasonic signal 103 and extracts the value of said property of the ambient noise from the carried data packet. Moreover, the main device 105 measures the power of the received ultrasonic signal 103, compares this received power against the power at which the ultrasonic signal 103 is transmitted, which is fixed and known, and from that comparison derives the attenuation that the ultrasonic signal 103 undergoes along its propagation path. By processing the attenuation of the received ultrasonic signal 103, the main device assesses the attenuation that the ringtone 104 undergoes, considering that it travels close over the same propagation path.

Then the main device adjusts the ringtone 104 to counterbalance both the annoying acoustic noise and the ringtone 104 attenuation, preferably also taking into account the user's preferences.

The user can specify her preferences not only for the general condition of usage, as offered by previous art technology, but also as a function of the ambient noise characteristics, or the ringtone 104 attenuation, or a combination of both of them each weighted with some weighting factor. The adjustment of the ringtone 104 can involve volume, sound, pitch, cadence, distribution in the frequency domain, evolution with the time, and other properties.

Figure 2:
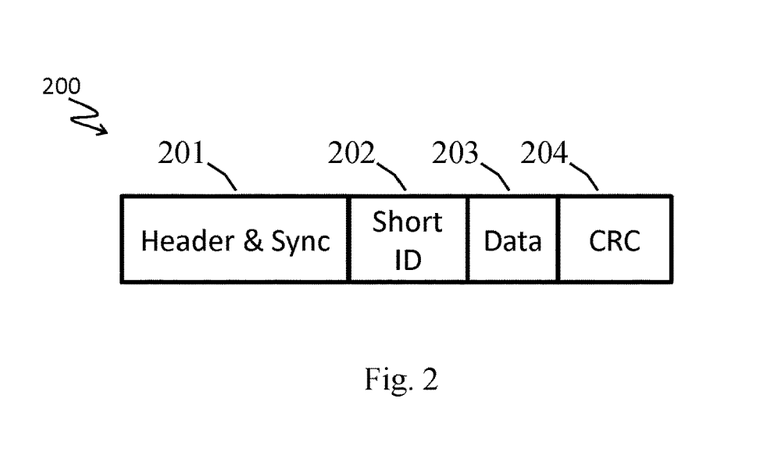
FIG. 2 shows an exemplary data packet format illustrating the structure of data carried by an ultrasonic signal 103 depicted in FIG. 1.

With also reference to FIG. 2, the data packet 200, carried but the ultrasonic signal 103, comprises the following main fields:

- Header & Sync 201, comprising at least a preamble, labelling the packet as a packet of an ultrasonic signal according the present invention, and a synchronization word allowing receivers to acquire symbol synchronization and detect the packet fields;
- short ID 202, to pair the adjustment accessory 102 with the main device 105;
- Data field 203, carrying the value of at least a property of the environmental acoustic noise (e.g., the psophometric noise power, quantized on few levels) and, in case, other data;
- CRC (Cyclic Redundancy Check) 204, for checking transmission errors and protecting packet content.

The total number of bit required by the above packet fields is small, while it is not necessary to test the environmental conditions and the propagation attenuation very frequently. Therefore, the adjustment accessory 102 consumes a low amount of energy and can be incorporated into small jewellery, such as brooches to be pinned on the chest, earrings, necklaces, hair ornaments, and others wearables.

Figure 3:
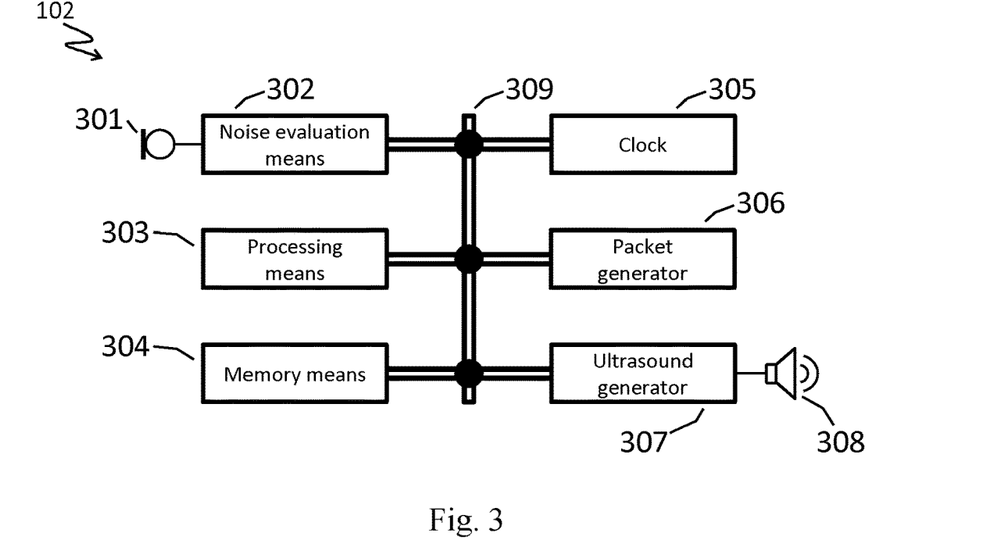
FIG. 3 shows a block diagram of the internal architecture of the adjustment accessory 102 depicted in FIG. 1.

With also reference to FIG. 3, the adjustment accessory 103 comprises the following parts:

- an audio microphone 301, to pick up the ambient acoustic noise;
- noise evaluation means 302, to assess at least the value of a property of the ambient acoustic noise;
- processing means 303, to execute instruction for managing the elements of the adjustment accessory, carrying out computational tasks, such as CRC computation, and others;
- memory means 304, to store at least the data and instructions used by other elements of the adjustment accessory 102 and, in particular, by the processing means 303;
- a clock 305, to provide timings for the elements of the adjustment accessory;
- a packet generator 306, to build up the data packet 200;
- ultrasound generator means apt to generate the ultrasonic signal 103, wherein said ultrasound generator means comprise an ultrasound generator 307 producing the ultrasonic signal 103, e.g., by modulating an ultrasonic carrier wave, and an ultrasound loudspeaker 308 configured for emitting the ultrasonic signal 103;
- a communication bus 309, which allows the exchange of information among the elements of the adjustment accessory described above.

As an alternative to using the communication bus 309, the connections among the elements of the adjustment accessory can be made through other architectures, e.g., a star connection.

Generally a main device 105 is a much more complex device than the adjustment accessory 102, however the number of elements involved in the automatic adjustment of the ringtone 104 of the present invention is about the same, and generally most of them can be implemented by means of elements already included in a mobile phone.

Figure 4:
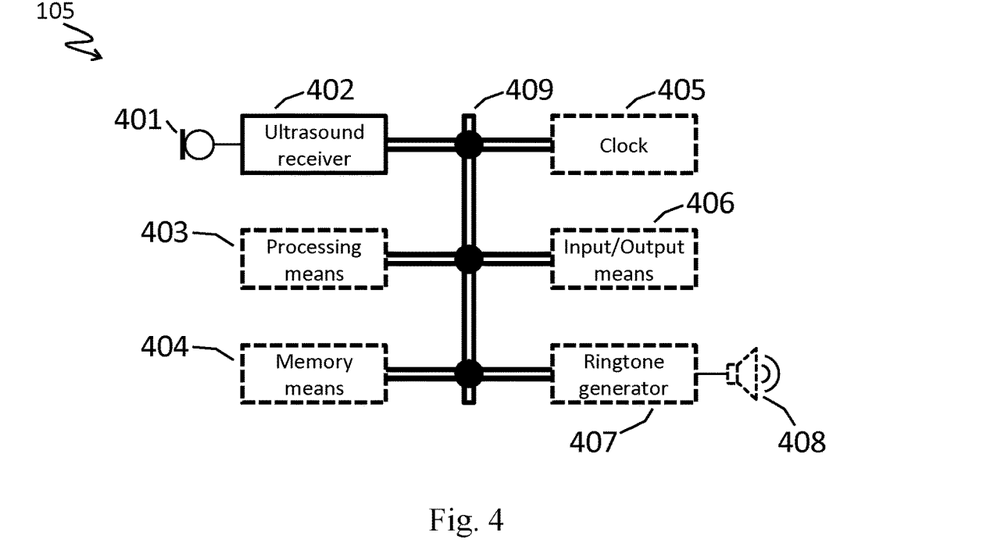
FIG. 4 shows a block diagram of the internal architecture of the main device depicted in FIG. 1.

With also reference to FIG. 4, the main device 105 according to the present invention may comprise the following parts:

- ultrasound receiver means comprising an ultrasound microphone 401, to pick up the ultrasonic signal generated by the adjustment accessory 102, and an ultrasound receiver 402 adapted to receive (and preferably decode) the ultrasonic signal 103 generated by the adjustment accessory 102;
- processing means 403, to execute instruction implementing a method for adjusting a ringtone according to the invention, carrying out computational tasks, such as parity check computation, error detection and correction, and the like;
- memory means 404, to store at least the data and instructions used by the other elements of the main device 105 and, in particular, by the processing means 403;
- a clock 405, to give timings to the elements of the main device 105;
- input/output means 406, adapted, for example, to load and update data and instruction, issue and receive commands, receive and emit audio signals, display information and pictures; such I/O means 406 may comprise, for example, USB, Firewire, RS232, IEEE 1284, Ethernet, or WiFi adapters, audio speaker, vibration generator, touch screen or the like and other adapters;
- ringtone generator means comprising a ringtone generator 407 adapted to generate an adjusted ringtone 104 according to the present invention, and an audio loudspeaker 408, in signal communication with the ringtone generator and in particular adapted to emit the ringtone 104 generated by the ringtone generator 407;
- a communication bus 409, which allows the exchange of information among the above-mentioned parts of the main device 105.

As an alternative to using the communication bus 409, the connections among the elements of the main device can be made through other architectures, e.g., a star connection.

More in detail, the processing means are configured for executing the following steps:

a. detecting a physical parameter of said at least one ultrasonic signal (e.g., its received power, or the like) and/or decoding content (e.g., value of ambient noise power, or the like) carried by said at least one ultrasonic signal 103, received through the ultrasound receiver means 401,402, e.g., by detecting the RMS voltage and/or power of an electrical signal produced from the ultrasound microphone 401 when the ultrasonic signal is sensed by said microphone 401;

b. determining, on the basis of the power of the received ultrasonic signal 103, the attenuation information that can quantify the attenuation suffered by the ultrasonic signal 103 along its propagation path and/or assess the attenuation of the acoustic signal 104;

c. determining, on the basis of said attenuation information, a physical property (e.g., volume, sound, pitch, cadence, distribution in the frequency domain, evolution with the time, and the like) of the acoustic signal (104) to be generated;

d. generating, through said ringtone generator 407, said acoustic signal 104 having the determined physical property, so that the probability to hear said acoustic signal (104) at the end of its propagation path increases.

Generally, most of the above elements can be implemented using means available within the main device for other purposes (in FIG. 4 these elements are shown in dashed lines). The only elements that could require dedicated hardware or software resources are the ultrasound microphone 401, adapted to receive the ultrasonic signal 103, and the associated ultrasound receiver 402. The skilled person could conceive, however, to utilise, as ultrasound microphone 401, the regular microphone that the main device may have. Most microphone models have in fact a sufficient sensitivity to sense pressure waves having frequencies higher than the hearing range of humans, i.e., ultrasound. However, smartphones usually also have two or more secondary microphones, placed at the top or back of the phone, for suppressing background noise: advantageously these microphones could be adapted to receive the ultrasonic signal 103, as they could be closer to the audio loudspeaker that emits the ringtone 104.

An advantageous solution, as said below, would be to adapt the audio loudspeaker 408, used for emitting the ringtone 104, also to receive the ultrasonic signal 103, since loudspeakers can actually work "in reverse" as microphones, as the skilled person knows.

Assuming that the propagation path travelled by the ringtone 104 is sufficiently close to that travelled by ultrasonic signal 103 in the reverse direction, the main device can assess the attenuation (i.e., determining the attenuation information) that the ringtone 104 undergoes by simply taking the value of the assessed ultrasound attenuation.

The main device can also take into account, however, some minor differences that may exist between the two propagation paths. At the side of the adjustment accessory 102 there may be a small difference of path attenuation in case, for example, of a brooch pinned on clothes (e.g., on the upper portion of a coat, i.e., on the chest) with respect to the optimum position of an earring. To account for those differences the data field 203 of the data packet 200 can carry few bits to classify the adjustment accessory 102 in regard to the position it can be worn: earrings or brooches or other wearables. In other words, the processing means 403 of the main apparatus 105 are also configured for decoding position information carried from the ultrasonic signal 103, wherein said position information can define the position of the accessory device 102 relative to a human ear, and wherein the processing means 403 are configured for determining the physical property of the acoustic signal 104 also on the basis of said position information; whereas the processing means 403 of the accessory 102 are configured for encoding position information into the ultrasonic signal 103 generated from said ultrasound generator means 307, 308, wherein said position information define the position of said accessory device 102 relative to a human ear. In this way, the probability to hear said acoustic signal 104 at the end of said propagation path is further increased because the processing means 403 are able to take into account the position of the accessory 103 relative to a human ear.

As far as the side of the main device is concerned, it is well known that a ringtone 104 suffers a significant attenuation if the emitting loudspeaker is muffled by some object, such as a cloth, a plane on which the object is placed, or something else. Therefore, the receiving ultrasound microphone 401 and the audio loudspeaker 408 emitting the ringtone 104 should be as close as possible. An advantageous solution would be to use a single bidirectional sound transducer both for emitting the ringtone 104 and picking up the ultrasonic signal 103. For example, the skilled person could adapt an audio loudspeaker 408 both for emitting a ringtone 104 and receiving the ultrasound signal 103, as said above. In other words, the ringtone generator means comprises a ringtone generator 407 and a loudspeaker in signal communication with both said ringtone generator 407 and said ultrasound receiver means 402, and wherein said loudspeaker is adapted to allow for both sensing the ultrasonic signal 103 and emitting the acoustic signal 104. In such a case, at the main device side the propagation paths of the ultrasonic signal 103 would perfectly match that of the ringtone 104. On the other hand, most mobile phones have two loudspeakers, therefore one of them could be designed to cope with the aforesaid bidirectional ability. In this way, the probability to hear said acoustic signal 104 at the end of the propagation path of the acoustic signal is further increased.

As said above, with the preferred embodiment of the invention the main device 105 assesses the attenuation that the ultrasonic signal 103 undergoes along its propagation path by comparing its power at the receive side against its power at the transmit side, which is fixed and known. Those power values, however, are affected by a number factors, the most important of which is the sensitivity of the ultrasound transducer at the receive side. Therefore, in practical embodiments, it could be advisable to perform a calibration, especially if the relevant transducers operate near a limit of their pass-band. Basically, pairing and calibration processes are performed at the factory, but the user should be given the possibility to carry out the pairing and calibration processes by himself/herself in case of replacement of the accessory device 102, or the addition of a new one to provide for a wearable alternative.

The main step of the calibration process is transmitting, by means of the accessory device 102, an ultrasonic signal burst, or a number of bursts in order to take an average, in a reference condition, and determining, by the main device 105, the received power. As a reference condition, the user should wear the accessory device 102 as he or she regularly does and keep the main device 105 in one hand so as the propagation path of the sound is clear. Moreover, both devices should stay far from objects that offer a high reflection factor for the acoustic waves.

The main device 105 must be put by the user, through input/output means 406, in a "calibration mode" in which calibration information are determined. More in details, the main device 105, when it is in the calibration mode, is configured for performing the following steps:
  measuring the receive power of the ultrasonic signal 103, possibly taking an average of the receive power over a number of signal bursts, i.e., determining the calibration information on the basis of the receive power;
  storing the result in the memory means 404 as a reference value, i.e., storing the calibration information.

The accessory device 102 could be in the regular working mode. With the preferred embodiment of the invention, however, the periodic emission of ultrasonic signals could have a long period and annoy the user. So it would be advantageous to put the accessory device 102 in a calibration mode too, wherein the required signal bursts are emitted in a short time interval and the calibration process is quick.

In other words, the processing means 403 of the main device 105 are configured for determining said at least one physical property of the acoustic signal 104 also on the basis of calibration information that define at least one physical property (e.g., power, RMS voltage, or the like) of a signal produced by the ultrasound receiver means (401,402) when an ultrasound generator is operated in a (predetermined) position with respect to the main device 105. In this way, the probability to hear said acoustic signal 104 at the end of said propagation path is further increased because the processing means 403 are able to take into account the characteristics (e.g., maximum output power or the like) of the accessory 103.

If the main device 105 has auxiliary short range transmission means by which it can transmit a command to the adjustment accessory 102, as considered below with a third embodiment of the invention, the adjustment accessory 102 can be put in a calibration mode through those means.

In the preferred embodiment of the invention, however, the accessory device 102 does not have input means, which the user can exploit to receive a command, except the microphone 301.

A first obvious solution is to provide the accessory device 102 with a micro switch or button to change the operation mode.

A second solution is configuring the main device 105 to emit, as activating signal for the accessory device 102, an audio signal carrying a particular code word, while the processing means 303 of the accessory device 102 are configured for detecting such code word, out of the audio signals received through the microphone 301 and the noise evaluation means 302, and, accordingly to the code word content, set the operation mode.

The transmission of that code word will entail an audible sound, but it is to be appreciated that this will occur only in few, particular circumstances. As an example, such activating signal could be a DTMF (Dual Tone Multi-Frequency) similar to that used in the analogue telephony for in band signalling.

The skilled person can, however, indicate many other suitable alternatives to send a command or data to the accessory device.

The ability to associate and calibrate an accessory device allows the user to have a number of different accessory devices associated to a single main device, as wearable alternatives for difference circumstances (e.g., an earring, a brooch, a bracelet, a watch, or other wearables). In this case the main device is configured for storing, in its memory means 404, the set of calibration information relevant to each associated accessory device, which is identified by the short ID 202, and recalling the relevant set when it detects a change of the short ID 202 carried by the data packet 200.

Preferably the frequency of the ultrasonic signal is slightly higher than the upper bound of hearing range of humans, and more preferably slightly higher than the upper bound of hearing range of infants, so as the propagation conditions of the ultrasonic signal 103 are as close as possible to that of the ringtone 104. However, the main device also could take into account the possible attenuation differences that the ringtone 104 suffers with respect to the ultrasonic signal 103.

The ultrasonic signal 103 can be made of short signal bursts, or employ a spread spectrum technique of a direct sequence type or a frequency hopping type, or a combination of these techniques. In case the transmission of the ultrasonic signal 103 is transmitted in bursts, both the elements of the adjustment accessory 102 and the relevant elements of the main device 105, except their clocks, could be put in the so called "sleep mode" during the time intervals of pause, when the ultrasonic signal 103 is powered down, in order to minimize energy consumption.

In the preferred embodiment of the invention, whatever technique employed for transmitting the ultrasonic signal 103, the data packet 200 is transmitted at periodic time intervals, with the period known to the main device 105. If within any time interval greater than a first time-out value, the main device 105 does not successfully decode at least one of said data packets 200, the main device 105 sets the volume of the ringtone 105 at a first pre-set level. In such a case, and in general when the adjustment accessory 102 is out of work for some reason (e.g., energy exhaustion), the automatic adjustment will not work, but signalling of incoming calls or messages are not missed.

Summarizing, a method for adjusting the at least a physical property of an acoustic signal 104 according to the invention comprises the following phases:

a. a receiving phase, wherein at least an ultrasonic signal 103, which can be generated by an accessory device 102, is received by means of an ultrasound receiver means 401,402;

b. a detection and/or decoding phase, wherein at least a physical parameter of and/or at least a content of said at least one ultrasonic signal 103 is detected by means of processing means 403;

c. an attenuation determination phase, wherein attenuation information, which can quantify the attenuation suffered by the ultrasonic signal 103 and/or the acoustic signal 104 along a propagation path, are determined, by means of the processing means 403, on the basis of said at least one physical parameter and/or content of said at least one ultrasonic signal 103 detected;

d. an adjustment phase, wherein a physical property (e.g., power, or the like) of the acoustic signal 104 to be generated is determined, by means of the processing means 403, on the basis of said attenuation information in order to ensure that said acoustic signal 104 may be heard;

e. a generation phase, wherein the acoustic signal 104 having said at least one determined physical property is generated through a ringtone generator 407, so that the probability to hear said acoustic signal 104 at the end of its propagation path increases.

It is highlighted that the phases of the method described above can be implemented by at least a portion of software code of a computer program product which can be loaded into the memory of an electronic computer.

OTHER EMBODIMENTS AND GENERALIZATIONS

In a second embodiment of the invention, the adjustment accessory 102 has audio acquisition means adapted to detect at least a variations of at least a property of the ambient acoustic noise and, when such variation exceeds a given threshold, the adjustment accessory 102 emits an ultrasound signal 103, or a series of ultrasound signals 103, to update the ringtone adjustment. The property that is checked for variation may be the noise power, possibly weighted according to some law (e.g., psophometric weighting), or the distribution of the noise components over the audio spectrum, or other characteristics. With the ability to detect ambient noise variations, the adjustment accessory 102 can timely detect when the environment around the user changes and update the ringtone adjustment accordingly. In other words, the accessory according to this embodiment comprises audio input means in signal communication with the processing means 303, wherein said processing means 303 are also configured for executing the following steps:

detecting, by means of the audio input means, at least a variations of at least a property of the ambient acoustic noise around said accessory;

emitting, through said ultrasound generator means, said at least one ultrasonic signal (103) when said at least one variations of said at least one property of the ambient acoustic noise is detected.

In this way, the probability of hearing the the ringtone is increased.

In a third embodiment of the invention, both the main device and the auxiliary device comprises (auxiliary) short range transmission means, so that the main device can request to the adjustment accessory to generate an ultrasonic signal carrying a data packet 200, or a series of data packets 200. The main device issues such a request, through said short range transmission means, before emitting a ringtone 105 or soon after having started the emission of a vibration, or a ringtone at a low volume, or a combination of them, and, when it receives a data packet 200, it adjusts the ringtone accordingly. The adjustment accessory receives said request through the corresponding short range transmission means, and transmits said data packet 200 through the ultrasonic carrier wave. If, since the issue of said transmission request, the main device 105 does not successfully decode at least one data packet 200 before the expiration of a second time-out, the main device 105 starts emitting an acoustic signal 105 at a second pre-set volume. Also in this case, a failure of the automatic adjustment feature does not entail a lack of signalling of incoming calls or messages. In other words, the main apparatus further comprises transmission means for requesting emissions of ultrasonic signals 103 to an accessory device 102 that is configured for emitting the ultrasonic signal 103 on request, and wherein the processing means 403 are also configured for requesting, through said transmission means, an emission of said ultrasonic signal 103; whereas, the accessory further comprises receiving means for receiving at least a request signal carrying a request of emission of ultrasonic signal, and the processing means 303 are configured for executing the following steps:

detecting, by means of said receiving means, said at least one request signal;

emitting, through the ultrasound generator means, said ultrasonic signal 103 when said at least one request signal is detected.

In this way, the probability of hearing the ringtone is increased.

It is to be appreciated that such auxiliary short range transmission means can be unidirectional, just to transmit a command from the main device 105 to the adjustment accessory 102, since the opposite transmission direction is covered by the ultrasonic signal 103. This auxiliary transmission can be implemented by means of known techniques, such as Bluetooth, ZigBee, RFID, NFC, WiFi, or others. With an RFID technique the adjustment accessory 102 could also harvest some energy and reduce requirements for its energy supply, so that its operation time can be extended. In other word, the receiving means are adapted to harvest energy from said at least one request signal, and said energy is used for supplying said accessory device. In this way, this embodiment allows more ringtone adjustments than the previously described embodiments, by exploiting an additional energy source, so that the probability to hear the ringtone is increased.

In a fourth embodiment of the invention, the main device comprises auxiliary short range transmission means as in the third embodiment, and also means for detecting at least a variations of at least a property of the ambient acoustic noise around the main device itself (e.g., a microphone and an analog-to-digital converter or the like) and/or means for detecting objects near to the loudspeaker 408 (i.e., near to the ultrasound receiver means) used for emitting ringtones (e.g., a capacitive sensor, a luminosity sensor, a CCD sensor, or the like). With such means, when the main device detects in its neighbourhood an environmental variation (variation of noise or position of close objects) exceeding a given threshold, the main device 105 issues a command for the adjustment accessory 102 to transmit a data packet 200, or a series of data packets 200. With this ability the main device 105 can timely detect when the environment around it changes and request an update of the ringtone adjustment.

The apparatus of the invention can also utilize a combination of the above abilities and/or other features. For instance, the adjustment accessory 102 can be adapted to both periodically transmit an ultrasound signal 103 and additionally have means to transmit an ultrasound signal 103 when a property of the ambient acoustic noise around the user varies by an amount exceeding a given threshold. In other words, the apparatus may further comprise audio input means in signal communication with the processing means 403, and wherein the processing means are configured for executing the following steps:

detecting, by means of the audio input means, at least a variations of at least a property of the ambient acoustic noise around said apparatus;
   requesting, through said transmission means, at least an emission of said ultrasonic signal 103 when said at least one variations of said at least one property of the ambient acoustic noise is detected.

Alternatively or in combination with the above-mentioned audio input means, the apparatus may further comprise proximity sensor means for detecting objects close to the ringtone generator means 407,408, and wherein the processing means are configured for executing the following steps:

detecting, by means of the proximity sensor means, the presence of at least an object close to the ringtone generator means;
   requesting, through said transmission means, at least an emission of said ultrasonic signal 103 when the presence of said at least one object is detected.

By using these features or a combination thereof, the probability of hearing the ringtone is increased, since more environmental factors are taken into account.

Similarly, a regular periodic transmission of an ultrasound signal 103 can be combined with transmissions of ultrasound signals 103 requested by the main device on the occurrence of some event. The skilled person understands that other advantageous combinations of features can be implemented, which are not mentioned here for the sake o brevity.

The present description has tackled some of the possible variants, but it will be apparent to the man skilled in the art that other embodiments may also be implemented, wherein some elements may be replaced with other technically equivalent elements. The present invention is not therefore limited to the explanatory examples described herein, but may be subject to many modifications, improvements or replacements of equivalent parts and elements without departing from the basic inventive idea, as set out in the following claims.

The invention claimed is:

1. A mobile communication apparatus for adjusting at least a physical property of an acoustic signal, comprising:
   a ringtone generator means adapted to generate the acoustic signal,
   processing means in signal communication with said ringtone generator means,
   ultrasound receiver means apt to receive at least an ultrasonic signal generated by an accessory device, said ultrasonic signal carrying a measure of a property of ambient noise, which is picked up by a microphone of an adjustment accessory, wherein the processing means are configured for:
   a. detecting at least a physical parameter and/or decoding at least a content of said at least one ultrasonic signal received through the ultrasound receiver means,
   b. determining, on a basis of said at least one physical parameter and/or content of said at least one ultrasonic signal, attenuation information that can quantify an attenuation suffered by the ultrasonic signal and/or allow an assessment of the attenuation suffered by the acoustic signal along a propagation path,
   c. determining, on a basis of said attenuation information, said at least one physical property of the acoustic signal, and
   d. generating, through said ringtone generator means, said acoustic signal having said at least determined physical property,
   said apparatus further comprising transmission means for requesting emissions of ultrasonic signals to the accessory device that is configured for emitting the ultrasonic signal on request, and wherein the processing means are also configured for requesting, through said transmission means, an emission of said ultrasonic signal,
   said apparatus further comprising audio input means in signal communication with the processing means, and wherein the processing means are configured for:
      detecting, by means of the audio input means, at least a variation of at least a property of the ambient acoustic noise around said apparatus, and
      requesting, through said transmission means, at least an emission of said ultrasonic signal when said at least one variation of said at least one property of the ambient acoustic noise is detected.

2. The apparatus according to claim 1, wherein said at least one content of said at least one ultrasonic signal comprises position information defining the position of the accessory device relative to a human ear, and wherein the processing means are configured for determining said at least one physical property of the acoustic signal also on the basis of said position information.

3. The apparatus according claim 1, wherein the ringtone generator means comprises a ringtone generator and a loudspeaker in signal communication with said ringtone generator, wherein said loudspeaker is also in signal communication with the ultrasound receiver means, and is adapted to allow for both sensing the ultrasonic signal (103) and emitting the acoustic signal.

4. The apparatus according to claim 1, further comprising proximity sensor means for detecting objects close to the ringtone generator means, and wherein the processing means are configured for:
   detecting, by means of the proximity sensor means, the presence of at least an object close to the ringtone generator means, and
   requesting, through said transmission means, at least an emission of said ultrasonic signal when the presence of said at least one object is detected.

5. The apparatus according to claim 1, wherein the processing means are configured for determining said at least one physical property of the acoustic signal also on the basis of calibration information defining at least one physical property of a signal produced by the ultrasound receiver means when an ultrasound generator is operated in a position with respect to said apparatus.

6. The apparatus according to claim 1, wherein said at least one physical property of said acoustic signal comprises power and/or frequency and/or pitch and/or cadence and/or distribution in the frequency domain and/or time evolution.

7. An accessory device for adjusting said at least one physical property of an acoustic signal generated by the mobile communication apparatus according to claim 1, comprising ultrasound generator means apt to generate at least an ultrasonic signal received from said mobile communication apparatus, said accessory device further comprising processing means in signal communication with said ultrasound generator means, and configured for controlling the emission of said at least one ultrasonic signal, said accessory device further comprising audio input means in signal communication with the processing means, wherein said processing means are also configured for:

detecting, by means of said audio input means, an audio signal, generating, on the basis of said audio signal, ambient noise information defining at least a property of the ambient acoustic noise around said accessory device, encoding said ambient noise information into the ultrasonic signal generated from said ultrasound generator means, detecting, by means of the audio input means, at least a variation of at least a property of the ambient acoustic noise around said accessory, and emitting, through said ultrasound generator means, said at least one ultrasonic signal when said at least one variation of said at least one property of the ambient acoustic noise is detected, said accessory device further comprising receiving means for receiving at least a request signal carrying a request of emission of ultrasonic signal, and wherein the processing means are configured for:

detecting, by means of said receiving means, said at least one request signal, and emitting, through the ultrasound generator means, said ultrasonic signal when said at least one request signal is detected.

8. The accessory device according to claim 7, wherein the processing means are also configured for encoding position information into the ultrasonic signal generated from said ultrasound generator means, wherein said position information defines the position of said accessory device relative to a human ear.

9. A method for adjusting at least a physical property of an acoustic signal generated from a mobile communication apparatus, the method comprising:

a. a receiving phase, wherein at least an ultrasonic signal, generated by an accessory device, is received by means of an ultrasound receiver means, said ultrasonic signal carrying a measure of a property of ambient noise, which is picked up by a microphone of an adjustment accessory, b. a detection and/or decoding phase, wherein at least a physical parameter of and/or at least a content of said at least one ultrasonic signal is detected by means of a processing means, c. an attenuation determination phase, wherein attenuation information, quantifying an attenuation suffered by the ultrasonic signal and/or the acoustic signal along a propagation path, are determined, by means of the processing means, on a basis of said at least one physical parameter and/or content of said at least one ultrasonic signal detected, d. an adjustment phase, wherein said at least one physical property of the acoustic signal to be generated is determined, by means of the processing means, on a basis of said attenuation information, e. a generation phase, wherein the acoustic signal having said at least one determined physical property is generated through a ringtone generator, f. wherein a variation of at least a property of the ambient acoustic noise around said apparatus or said accessory device is detected, and g. requesting, through a transmission means, at least an emission of said ultrasonic signal when said at least one variation of said at least one property of the ambient acoustic noise is detected.

* * * * *